United States Patent [19]

Okamoto

[11] Patent Number: 4,749,944
[45] Date of Patent: Jun. 7, 1988

[54] LOAD DETECTING DEVICE FOR GENERATOR

[75] Inventor: Kenji Okamoto, Higashimatsuyama, Japan

[73] Assignee: Diesel Kiki Co., Ltd., Tokyo, Japan

[21] Appl. No.: 804,146

[22] Filed: Dec. 3, 1985

[30] Foreign Application Priority Data

Dec. 4, 1984 [JP] Japan ............................... 59-255027

[51] Int. Cl.⁴ ...................... G01R 19/04; G01R 31/02
[52] U.S. Cl. ............................... 324/158 MG; 322/27; 322/99
[58] Field of Search .............. 324/158 MG; 322/7, 8, 322/27, 99; 318/490; 340/648; 361/20, 21

[56] References Cited

U.S. PATENT DOCUMENTS

| | | | |
|---|---|---|---|
| 1,943,524 | 1/1934 | Godsey, Jr. .................... | 322/27 |
| 3,701,556 | 10/1972 | Richmond .................... | 290/40 B |
| 3,727,133 | 4/1973 | Marvin et al. .............. | 324/158 MG |
| 4,141,244 | 2/1979 | Dumbeck ...................... | 318/490 |
| 4,194,178 | 3/1980 | Dumbeck ...................... | 340/648 |
| 4,229,694 | 10/1980 | Wilson et al. ............... | 324/158 MG |
| 4,350,947 | 9/1982 | Uenossono et al. ........... | 322/99 |
| 4,413,325 | 11/1983 | Elfner et al. .................. | 340/648 |
| 4,417,194 | 11/1983 | Curtiss et al. ................. | 290/40 B |
| 4,527,101 | 7/1985 | Zavis et al. ................... | 318/490 |

FOREIGN PATENT DOCUMENTS

| | | | |
|---|---|---|---|
| 3138554 | 4/1983 | Fed. Rep. of Germany ...... | 324/158 MG |
| 0182498 | 10/1983 | Japan ............................. | 290/40 B |
| 0758374 | 8/1980 | U.S.S.R. ........................ | 361/20 |
| 0924637 | 4/1982 | U.S.S.R. ........................ | 324/158 MG |

OTHER PUBLICATIONS

"Dynamic Response Measurement of Motor Characteristics", by Chambers et al., IBM Tech. Disc. Bull., vol. 14, #2, 7/71, p. 392.

Primary Examiner—Reinhard J. Eisenzopf
Assistant Examiner—W. Burns
Attorney, Agent, or Firm—Birch, Stewart, Kolasch & Birch

[57] ABSTRACT

A load detecting device for a generator driven by an engine and supplying power to a load includes a rotary angle detector for producing a pulse signal at every predetermined rotary angle of the generator or engine, a load detector for detecting a load current of the generator, and an output unit for receiving the outputs from the rotary angle detector and load detector, and outputting a load signal of the generator. The load detector produces a voltage signal corresponding to a detected load current. The load signal output unit takes out a voltage value of the voltage signal from the load detector at every rotary angle capable of detecting a load change on the base of the pulse signal from the rotary angle detector, and outputs said voltage value as the load signal.

13 Claims, 4 Drawing Sheets

LOAD DETECTING DEVICE FOR GENERATOR

BACKGROUND OF THE INVENTION

The present invention relates to a load detecting device for generators, in particular, relates to a load detecting device for detecting a change in load conditions of a generator driven by engines such as a diesel engine.

For a generator driven by such as a diesel engine, it is desired to make the permanent speed change and the transient speed difference small so that the output frequency or the revolutions of the generator is kept at a predetermined value even when an electrical load thereof varies. In a known control apparatus for controlling the revolutions of a generator, the permanent speed change and the transient speed difference are controlled to make them small by the following method, for instance. First, a signal representative of a difference between the actual revolutions and the set revolutions of a generator is integrated, and, by this integrated signal, the amount of supply fuel to the engine is controlled. Thus, the engine will be controlled so that the permanent speed change of the generator becomes zero, i.e., the speeds before and after the load change become equal. Second, a load current of the generator is detected, and the amount of supply fuel to the engine is controlled on the base of a change of the load current, before a substantial change of engine speed which might be caused by the load change appears. Thus, the engine will be controlled so that the transient speed difference of the generator becomes small, i.e., the engine speed is controlled to the set speed rapidly. Therefore, the known control apparatus reduces the permanent speed change to zero and reduces the transient speed difference small.

A conventional load detecting device used with the known speed control apparatus for detecting an electrical load of the generator includes a current transformer which detects a load current of the generator, a resistor connected in parallel with the transformer winding and providing a AC voltage signal corresponding with the detected load current, a rectifier rectifying the AC voltage signal, and a ripple filter smoothing the output of the rectifier and providing a DC voltage signal in proportion to the load current. An example of the load detecting apparatus has been shown in the Japanese Utility Model Laid Open Publication No. 7072/1983.

Such a prior load detecting device, however, has a problem that detection of a load change becomes slow due to a time constant of the ripple filter. This problem will become more clear by reference to FIG. 1.

FIG. 1 illustrates waveforms for explaining the operation of a prior load detecting device. FIG. 1(a) represents a load current detected by the current transformer, and FIG. 1(b) represents a voltage signal A and a DC voltage signal B. The voltage signal A is produced through a full-wave rectifier of an AC voltage representative of the load current. The DC voltage signal B is produced by smoothing the voltage signal A through the ripple filter. As apparent from FIG. 1, when a load change occurs, the level of DC voltage signal B changes gently due to the time constant of the ripple filter, so that the DC voltage signal B cannot follow an abrupt change of load. Therefore, the detection of the load change is delayed.

SUMMARY OF THE INVENTION

It is an object, therefore, of the present invention to overcome the disadvantages and limitations of a prior load detecting device by providing a new and improved load detecting device for a generator.

It is another object of the present invention to provide a load detecting device capable of rapidly detecting a load change.

It is still another object of the present invention to provide a load detecting device capable of greater suppression of the transient speed difference than possible with the prior art, when applied to a speed control apparatus for a generator.

The above and other objects are attained by a load detecting device comprising of rotary angle detector means for producing a pulse signal at every predetermined rotary angle of a generator or engine; load detector means for detecting a load current of said generator and producing a voltage signal corresponding to a detected load current; and means for receiving said pulse signal and voltage signal, taking out a voltage value of said voltage signal at every rotary angle capable of detecting a load change, on the base of said pulse signal, and outputting said voltage value as a load signal.

BRIEF DESCRIPTION OF THE DRAWINGS

The foregoing and other objects, features, and attendant advantages of the present invention will be appreciated as the same become better understood by means of the following description and accompanying drawings wherein.

DETAILED DESCRIPTION OF THE INVENTION

Figure 1:
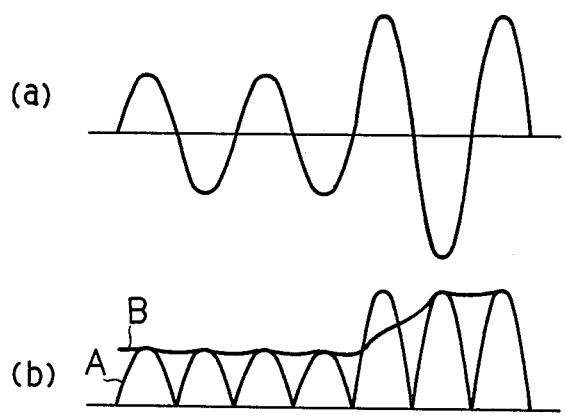
FIG. 1 shows waveforms for explaining the operation of a prior load detecting device.
Figure 2:
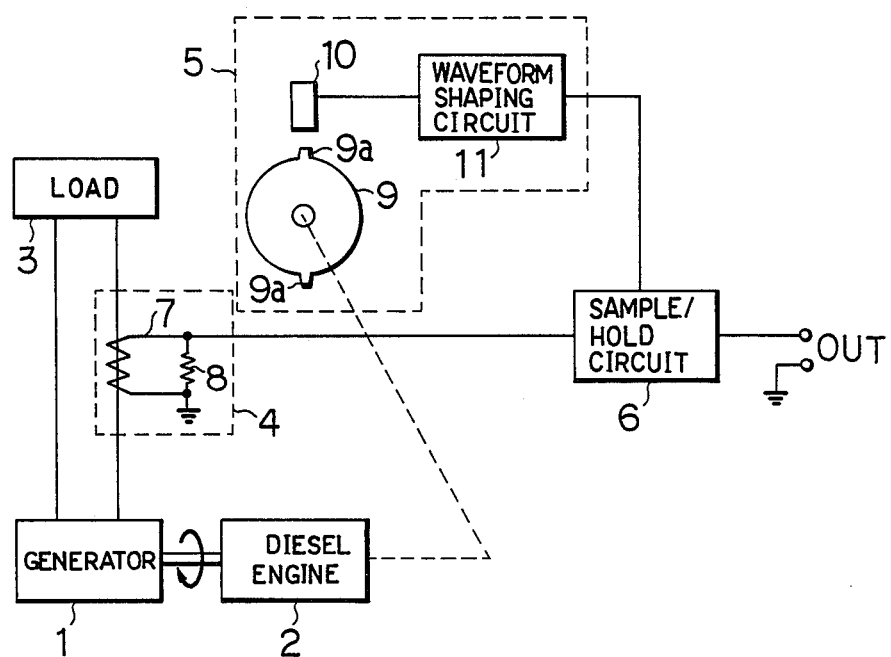
FIG. 2 is a block diagram showing an embodiment of the load detecting device according to the present invention.

FIG. 2 shows an embodiment of the load detecting device according to the present invention. Referring to FIG. 2, an AC generator 1 is driven by a diesel engine 2 to supply power to a load 3. In such a power generator system, the load detecting device comprises a load detector 4 and a rotary angle detector 5, both outputs of which are coupled to a sample-and-hold circuit 6.

The load detector 4 is constructed of a current transformer 7 for detecting a load current, and a resistor 8 connected in parallel with the output winding of the transformer 7. The load detector 4 detects the load current and produces a corresponding AC voltage. The rotary angle detector 5 is constructed of a pulser 9, a magnetic pickup 10 and a waveform shaping circurt 11. The pulser 9 is fixed on the crank shaft of the engine 2 and rotated thereabout. The magnetic pickup 10 generates an induction voltage at every predetermined rotary angle of the engine 2 through interaction with the pulser 9. The waveform shaping circuit 11 shapes the output of the magnetic pickup 10 into a pulse waveform. Thus, the rotary angle detector 5 outputs a pulse signal at every predetermined rotary angle of the engine 2. In this embodiment, the pulser 9 has two cogs 9a spaced diametrically by 180 degrees. The rotary angle detector 5 outputs the pulse signal every time the cog 9a of the pulser 9 faces the magnetic pickup 10. The sample-and-hold circuit 6 holds the output voltage of the load detector 4 in response to the output pulse of the rotary angle detector 5, and outputs the held voltage as a load signal of the generator 1.

Figure 3:
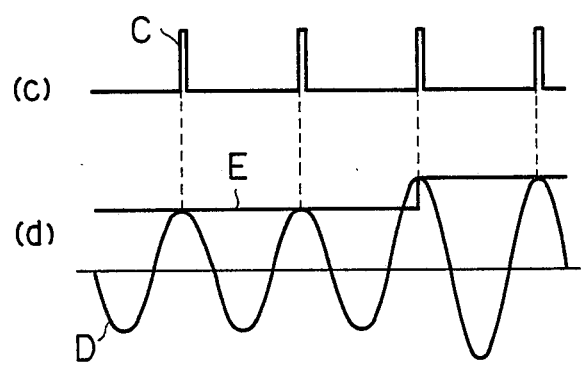
FIG. 3 is a view for explaining the operation of the load detecting device of FIG. 2.

FIG. 3 shows waveforms for explaining the operation of the load detecting device of FIG. 2. FIG. 3(c) represents the output pulses C of the rotary angle detector 5, and FIG. 3(d) represents the output voltage D of the load detector 4 and the load signal E which is the output of the sample-and-hold circuit 6.

In the above embodiment, it is here assumed that the generator 1 is driven at 1500 rpm and supplies 50 Hz power to the load 3. Since the rotary angle detector 5 outputs two pulses every one revolution of the generator 1, when the generator 1 is driven at 1500 rpm, the rotary angle detector 5 delivers the output pulses C at a rate of 50 pulse/sec. The phase of load current of the engine 2 is in synchro with the rotary angle of the generator 1, so that the relationship between the output voltage D of the load detector 4 and the output pulses C of the rotary angle detector 5 becomes as shown in FIG. 3. That is, one output pulse C is assigned to each cycle of the output voltage V at the same phase angle.

Since the output pulse C and output voltage D having the above relationship are inputted to the sample-and-hold circuit 6, the output voltage D is held at the same phase angle for each cycle thereof. The held voltage is, then, outputted from the sample-and-hold circuit 6 as the load signal E. As shown in FIG. 3, when a load change occurs, since the output voltage D changes in conformity with the change of load current, the voltage value held at that time also changes. As a result, the load signal E quickly changes without delaying from the time the load change occurs.

In the above embodiment, although the output voltage D is held near at the maximum of its amplitude, it is not intended to be limited thereto. A phase angle where the output voltage D is held may be selected in an optional angle where the load change can be detected.

Figure 4:
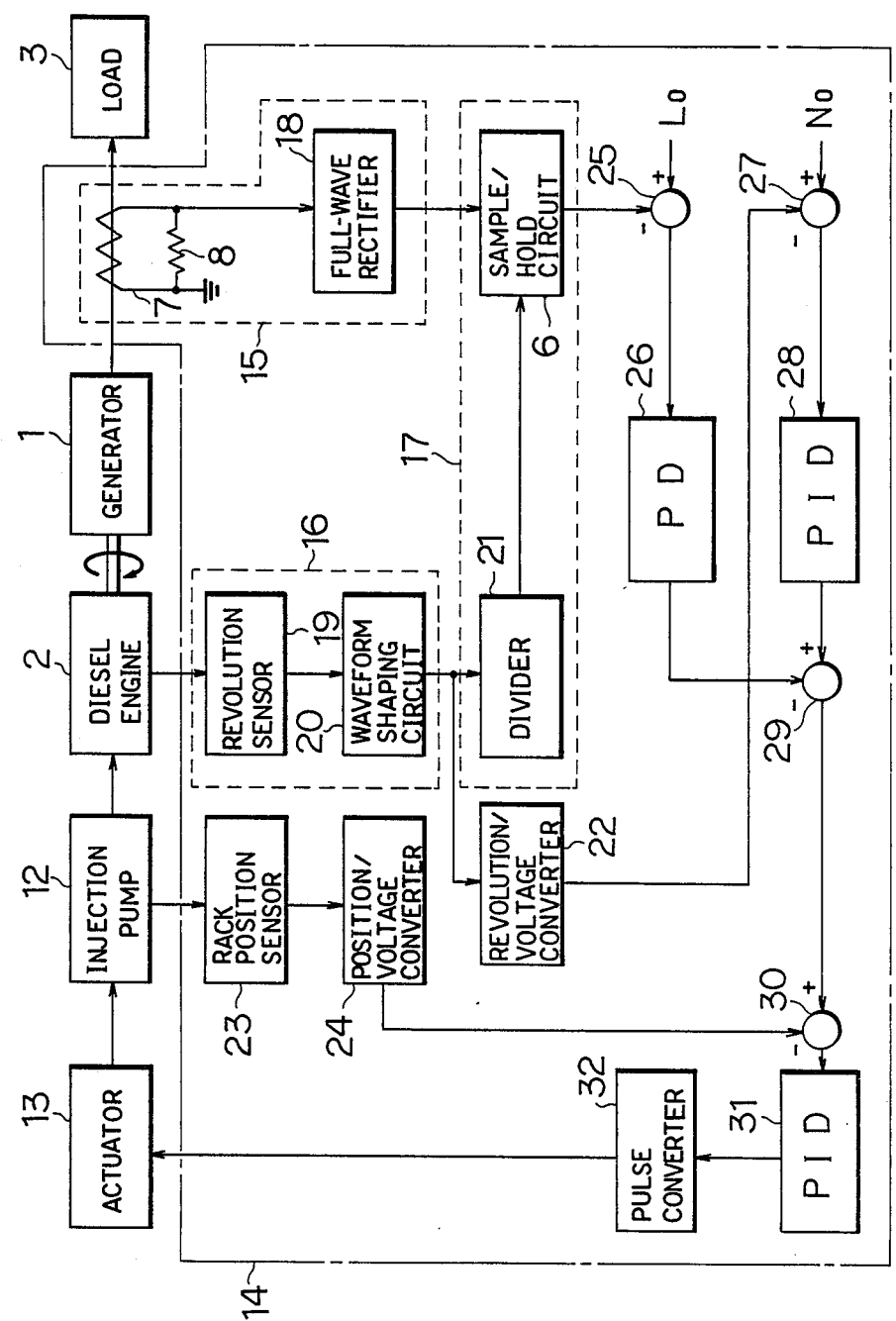
FIG. 4 is a block diagram showing an example of a speed control apparatus for a diesel-engine generator using the load detecting device of the present invention.

FIG. 4 shows an example of a speed control apparatus for a generator, which is driven by a diesel engine, using the load detecting device according to the invention. Referring to FIG. 4, a generator 1 is driven by a diesel engine 2 and supplies power to a load 3. The engine 2 is fed with fuel from a fuel injection pump 12. Control of the amount of fuel supply to the engine 2 is performed with an actuator 13 which adjusts the position of a control rack in the injection pump 12. The actuator 13 is supplied with a control signal from the speed control apparatus 14, the control signal being used for maintaining the revolutions of the generator 1 at a preset value even during the time a load change occurs.

The speed control apparatus 14 comprises a load detector unit according to the invention, a speed detector unit for detecting the revolutions of the engine 2, a position detector unit for detecting the rack position in the injection pump 12, and a control unit for operating, based on the results of the above three detector units, the control signal to be supplied to the actuator 13.

The load detector unit includes a load detector 15, a rotary angle detector 16 commonly used in the speed detector unit, and load signal output means 17. The load detector 15 includes a current transformer 7, a resistor 8 and a full-wave rectifier 18, and outputs a load current in the form of a full-wave rectified AC voltage signal. The rotary angle detector 16 includes a revolution sensor 19 constructed of a pulser and a magnetic pickup, and a waveform shaping circuit 20. The rotary angle detector 16 outputs a pulse signal at every predetermined rotary angle. The load signal output means 17 includes a sample-and-hold circuit 6 and a divider 21, holds the full-wave rectified voltage signal outputted from the load detector 15 at a timing of the pulse signal obtained through division of the output of the rotary angle detector 16, and outputs the held signal to the control unit.

The speed detector unit includes the rotary angle detector 16 commonly used in the load detector unit and a revolution/voltage converter 22, derives a voltage signal representative of the revolutions of the engine 2 based on the output pulses of the rotary angle detector 16, and outputs the voltage signal to the control unit.

The position detector unit includes a rack position sensor 23 and a position/voltage converter 24, derives a voltage signal representative of a rack position at the injection pump 23, and outputs the voltage signal to the control unit.

The control unit comprises adders 25, 27, 29, 30, a PD controller 26, PID controllers 28, 31, and a pulse converter 32.

The adder 25 is inputted with the load signal of the sample-and-hold circuit 6 and a load reference value $L_0$, and outputs a difference between the detected load signal and the load reference value $L_0$ to the PD controller 26. The PD controller 26 performs a PD (proportion+differentiation) operation for the output of the adder 25, and outputs a rack drive voltage suitable for the load condition.

The adder 27 is inputted with the voltage signal representative of the revolutions supplied from the revolution/voltage converter 22 and set revolutions $N_0$, outputs a difference between the voltage signal and the set revolutions $N_0$ to the PID controller 28. The PID controller 28 performs a PID (proportion+integration+differentiation) operation for the output of the adder 27, and outputs a rack drive voltage suitable for the revolutions of the engine 2.

The adder 29 is inputted with the rack drive voltage suitable for the load condition from the PD controller 26 and the rack drive voltage suitable for the revolutions from the PID controller 28, and applies a summing output thereof to the next adder 30. The adder 30 adds the voltage signal representative of the rack position from the position/voltage converter 24 to the output of the adder 29 so that the voltage signal of the position/voltage converter 24 is subtracted from the output of the adder 29, and applies its output to the PID controller 31. The PID controller 31 performs a PID operation for the output of the adder 30, and generates a rack drive voltage for adjusting the position of the control rack of the injection pump 12 so as to be suitable for the detected load and the revolutions. The generated rack drive voltage of the PID controller 31 is supplied to the pulse converter circuit 32. The pulse converter circuit 32 converts the rack drive voltage of the PID controller 31 into pulses, and outputs them to the actuator 13.

Figure 5:
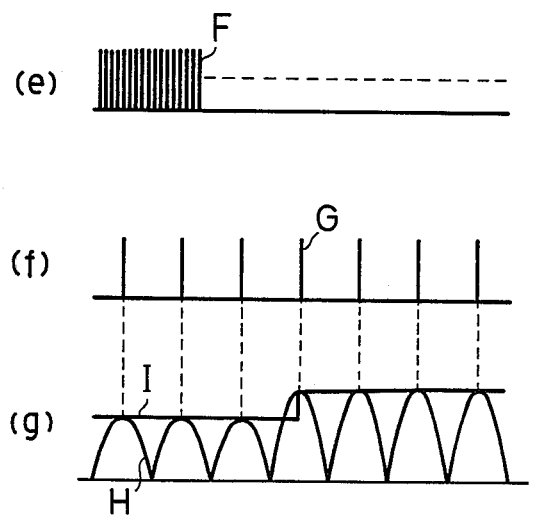
FIG. 5 shows waveforms for explaining the operation of the load detector unit shown in FIG. 4.

FIG. 5 is a view for explaining the operation of the load detector unit shown in FIG. 4. FIG. 5(e) represents the output pulses F of the rotary angle detector 16, FIG. 5(f) represents the output pulses G of the divider 21, and FIG. 5(g) represents the output voltage H of the load detector 15 and the load signal I of the load signal output means 17.

It is here assumed that the generator 1 is driven at 1500 rpm and supplies 50 Hz power to the load 3, and that the pulser of the revolution sensor 19 has for example 40 cogs at equal intervals, which number of teeth is commonly used for detection of the revolutions of the engine. In this embodiment, the rotary angle detector 16, accordingly, outputs 40 pulses for each one revolution of the generator 1. Therefore, when the generator 1 is driven at 1500 rpm, the output pulses F are generated at a rate of 1000 pulse/sec. Also, since the output frequency of the generator 1 is 50 Hz and the voltage signal H of the load detector 15 is full-wave rectified, upon 1/10 division of the output pulses F, a relationship as shown in FIG. 5 is obtained between the output pulses G and the output voltage H. Consequently, the voltage signal H is held at each half cycle, and then, the load signal I as shown in FIG. 5 is provided from the load detector unit to the control unit.

As apparent from FIG. 5, when a load change occurs, the load signal I also changes in response to the load change without any delay. The control unit, then, supplies to the actuator 13 the control signal for compensating the load change in accordance with the deviation between the load signal I and the load reference value $L_0$. Therefore, the control rack of the injection pump 12 is moved to compensate for the load change, and then, the amount of fuel supply to the engine 2 is controlled.

The revolutions of the engine 2 begin to change shortly after the load change occurs. However, since the amount of fuel supply has been controlled on the base of the load signal I before the speed change occurs, the speed change of the engine 2 can be suppressed. In addition to the above, if the speed change occurs, the control signal for compensating such speed change of the engine 2 is supplied to the actuator 13 on the base of the deviation between revolutions detected by the speed detector unit and the set revolutions $N_0$, so that the control rack of the injection pump 12 is further moved to compensate the load change. Consequently, the speed change is further suppressed.

In the load detector unit of FIG. 4 described above, the voltage signal corresponding to the load current of the generator 1 is full-wave rectified, and held at each half cycle of the rectified voltage signal. Therefore, when compared with the load detecting device shown in FIG. 2, the ability to analyze the load change doubles, and thereby a detection of the load change is performed more rapidly.

Figure 6:
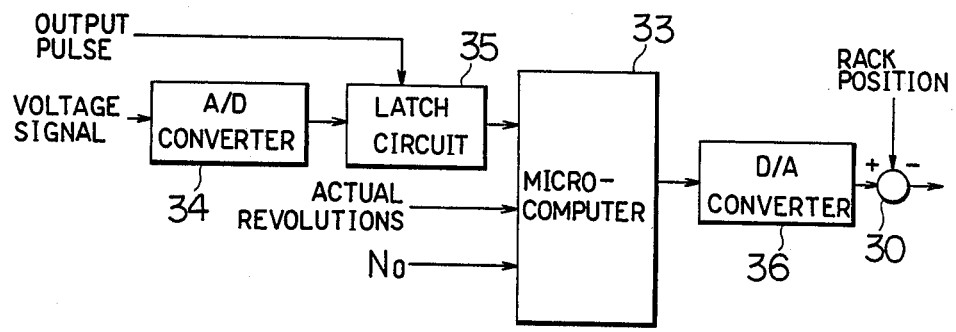
FIG. 6 is a block diagram showing another example of a speed control apparatus for a diesel-engine generator using the load detecting device of the present invention.

FIG. 6 shows another example of a speed control apparatus for a generator, which is driven by a diesel engine, using the load detecting device according to the invention. The block diagram of FIG. 6 is added to that of FIG. 4 excluding therefrom the sample-and-hold circuit 6, the revolution/voltage converter 22, the adders 25, 27, 29, the PD controller 26 and the PID controller 28.

A microcomputer 33 substitutes for the functions of the adders 25, 27 and 29, the PD controller 26 and the PID controller 28, and operates rack movement quantities suitable for the load condition and the engine revolutions respectively. An A/D converter 34 is inputted with the voltage signal of the load detector 15 in FIG. 4, and supplies that voltage signal to a latch circuit 35 after converting it into a digital form. The latch circuit 35 latches the output of the A/D converter 34 in response to the output pulses of the divider 21 of FIG. 4, and supplies the load information of the engine 1 to the microcomputer 33. The load reference value $L_0$ is either stored as internal data or set from an external. The output pulses of the rotary angle detector 16 of FIG. 4 are supplied as the information of revolutions to the microcomputer 33. The set revolutions $N_0$ is set from an external. The signals representative of the rack movement quantities suitable for the load condition and the revolutions, respectively operated at the microcomputer 33, are supplied via a D/A converter 36 to the adder 30 of FIG. 4. The adder 30, as previously described with FIG. 4, adds the voltage signal representative of the rack position supplied from the position/voltage converter 24 to the output of the D/A converter 30 so that the voltage signal of the position/voltage converter 24 is subtracted from the output of the D/A converter 30, and supplies a summing output thereof to the PID controller 31. The output of the PID controller 31 is supplied via the pulse converter 32 to the actuator 13.

The operation of the above embodiment is similar to that of the speed controller of FIG. 4 except that data is processed in part in a digital fashion. In the above construction, the latch pulses to the latch circuit 35 is supplied from the divider 21. In contrast with this, the microcomputer 33 may be utilized for supply of such latch pulses. In particular, the latch pulses to be supplied to the latch circuit 35 may be generated by the microcomputer 33 by using the output pulses from the rotary angle detector 16.

As described above in detail, according to the present invention, based upon the fact that the load current of the generator synchronizes with its rotary angle, the voltage signal corresponding to the load current is held at every predetermined rotary angle, thereby the load signal is obtained. Therefore, it is possible to rapidly detect the load change of the generator. Furthermore, since the present load detecting device can rapidly detect the load change, the transient speed difference of the generator can be reduced when the apparatus is applied to the speed controller of the generator.

From the foregoing it will now be apparent that a new and improved load detecting device has been found. It should be understood of course that the embodiments disclosed are merely illustrative and are not intended to limit the scope of the invention. Reference should be made to the appended claims, therefore, rather than the specification as indicating the scope of the invention.

What is claimed is:

1. A load detecting device in a control system for an engine driving a rotary A.C. generator to supply A.C. current to a load which may fluctuate, comprising:
  load current detector means for detecting the A.C. current supplied by said A.C. generator to said load and for developing an A.C. current value signal indicative thereof;
  rotary angle detector means for developing a pulse train signal including a pulse for each predetermined incremental angle of rotation of said A C. generator; and load signal output means, responsive to said A.C. current value signal and said pulse train signal, for developing an output signal representative of the value of said A.C. current value signal at the time a said pulse of said pulse train signal is received, said output signal being updated to a new value of said A.C. current value signal upon receipt of each said pulse of said pulse train signal.

2. The device of claim 1 further comprising means for controlling said engine in response to said output signal.

3. The device of claim 1, wherein said load current detector means comprises a current transformer for detecting said load current, and a resistor inserted in parallel with an output side of said current transformer for providing said A.C. current value signal.

4. The device of claim 3, wherein said rotary angle detector means comprises a pulser and pickup which generate an induction voltage at or near the maximum amplitude of said A.C. current value signal at every one cycle thereof, and a waveform shaping circuit which receives said induction voltage and develops said pulse train signal.

5. The device of claim 3, wherein said rotary angle detector means comprises:
a pulser and pickup which generate a plurality of induction voltages at predetermined angle intervals during one cycle of said voltage signal,
a waveform shaping circuit, responsive to said induction voltages, for developing a pulse train, and
a divider, responsive to said pulse train, for developing each pulse of said pulse train signal at or near a phase angle of the maximum amplitude of said A.C. current value signal at every one cycle of said voltage signal.

6. The device of claim 1, wherein said load current detector means comprises:
a current transformer for detecting said load current,
a resistor inserted in parallel with an output side of said current transformer and providing an A.C. voltage representative of said load current, and a full-wave rectifier circuit which receives said A.C. voltage from said resistor and provides a full-wave rectified signal as said A.C. current value signal;
wherein said rotary angle detector means provides a pulse of said pulse train signal at or near a phase angle of a maximum amplitude of said A.C. current value signal at every half cycle thereof.

7. The device of claim 5, wherein said rotary angle detector means comprises a pulser and pickup which generate an induction voltage at or near maximum amplitude of said A.C. current value signal at every half cycle thereof, and a waveform shaping circuit which receives said induction voltages and develops said pulse train signal.

8. The device of claim 6, wherein said rotary angle detector means comprises:
a pulser and pickup which generate a plurality of induction voltages at predetermined angle intervals during each cycle of said voltage signal,
a waveform shaping circuit, responsive to said induction voltages, for developing a pulse train, and
a divider, responsive to said pulse train, for developing each pulse of said pulse train signal at a phase angle at or near the maximum amplitude of said voltage signal at every half cycle thereof.

9. The device of claim 1, wherein said load signal output means is a sample-and-hold circuit which holds said A.C. current value signal received from said load signal detector means upon receipt of said pulse of said pulse train signal from said rotary angle detector means, to provide said output signal.

10. The device of claim 1, wherein said load signal output means includes an A/D converter for A/D converting said A.C. current value current from said load signal detector means, and a latch circuit for latching an output of said A/D converter in response to said pulse signal from said rotary angle detector means, to provide said output signal.

11. The device of claim 2, wherein said means for controlling controls the rotational output speed of said engine to be relatively constant.

12. The device of claim 2, wherein said means for controlling varies the supply of fuel to said engine.

13. The device of claim 12 wherein said engine is a diesel engine.

* * * * *